US008330509B2

(12) United States Patent
    Leistner

(10) Patent No.: US 8,330,509 B2
(45) Date of Patent: Dec. 11, 2012

(54) SUPPRESSION OF LOW-FREQUENCY NOISE FROM PHASE DETECTOR IN PHASE CONTROL LOOP

(75) Inventor: Andreas Leistner, Grasbrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 303 days.

(21) Appl. No.: 12/758,393

(22) Filed: Apr. 12, 2010

(65) Prior Publication Data
     US 2011/0248753 A1    Oct. 13, 2011

(51) Int. Cl.
     *H03L 7/06* (2006.01)
(52) U.S. Cl. ........................... 327/156; 327/147
(58) Field of Classification Search .................. 327/2–3, 327/13, 147–161
     See application file for complete search history.

(56) References Cited

U.S. PATENT DOCUMENTS

| 5,109,531 A * | 4/1992 | Heck ................................ 455/47 |
| 7,683,723 B2 * | 3/2010 | Akamine et al. ................ 331/16 |
| 7,944,276 B2 * | 5/2011 | Nakai ........................... 327/536 |

* cited by examiner

*Primary Examiner* — Dinh T. Le
(74) *Attorney, Agent, or Firm* — Eschweiler & Associates, LLC

(57) ABSTRACT

The disclosed invention provides a structure and method for improving performance of a phase locked loop by suppressing low-frequency noise produced by a phase detector. This is achieved by up-conversion of the in-band frequency components in the phase difference between reference signal and feedback signal to a higher frequency range where noise performance of a phase detector is improved. The up-converted phase difference is provided to a phase detector that is configured to determine an error signal based upon this phase difference. The error signal is output to a down-converter configured to down-convert the error signal (e.g., back to the original frequency range), thereby intrinsically up-converting the error signal's low-frequency noise (produced by the phase detector), prior to being provided to a filter configured to filter the up-converted noise, thereby resulting in an improved PLL noise performance.

23 Claims, 8 Drawing Sheets

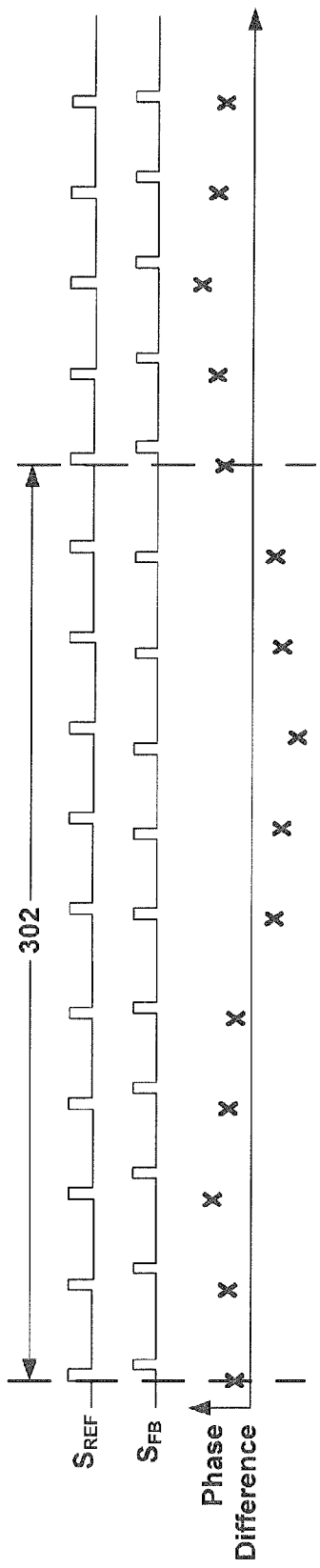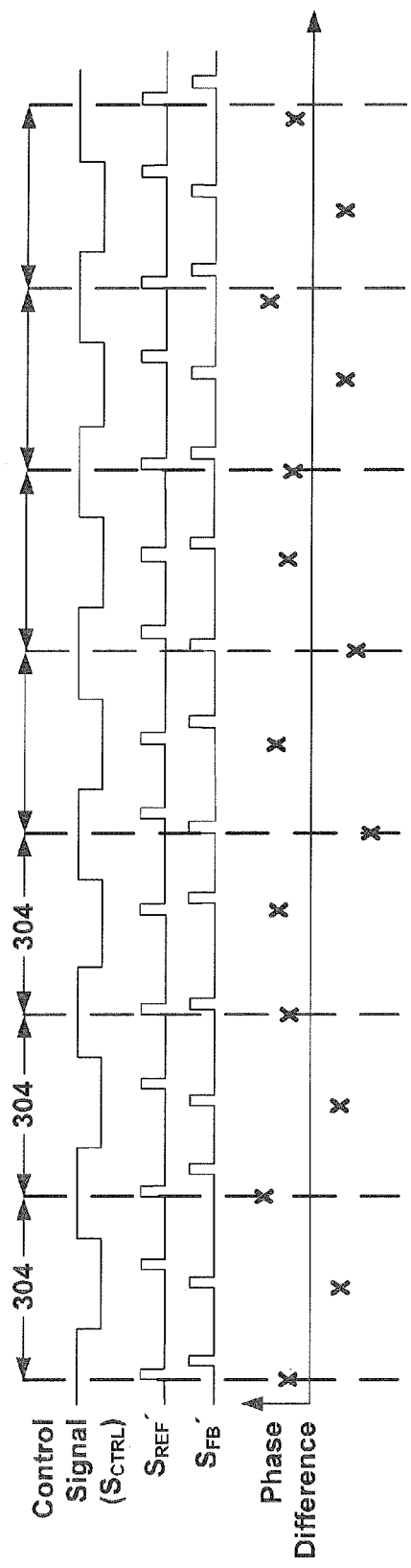

SUPPRESSION OF LOW-FREQUENCY NOISE FROM PHASE DETECTOR IN PHASE CONTROL LOOP

FIELD OF INVENTION

The present invention relates generally to phase-locked loops and in particular to a method and apparatus for suppressing low frequency flicker noise in a phase detector of a phase-locked loop.

BACKGROUND OF THE INVENTION

Phase locked loops are widely used in a variety of modern day electronic circuits including communication devices, integrated chips, etc. In general, phase locked loops are feedback systems configured to generate a signal having a fixed phase in relation to a reference signal.

More particularly, a phase locked loop (PLL) is a control circuit comprising a feedback loop having a phase detector that receives a reference signal and a feedback signal from a controlled oscillator. The phase of the input signals (e.g., reference signal, feedback signal) is defined by a point in time when relevant events (e.g., rising edges) occur. The phase detector determines a phase difference between the input signals (e.g., a time between rising edges) and based upon the measured phase difference generates an error signal that is output to a filter (e.g., a loop filter). The filter may be used to convert the error signal to an oscillator control signal that is used to control the frequency of the controlled oscillator.

Based on the oscillator control signal, the controlled oscillator oscillates at a higher or lower frequency, which affects the phase and frequency of the feedback signal. In particular, the phase detector error signal is used to align the phase of the reference signal and the feedback signal. When the phases (e.g., clock edges) of the feedback signal and the reference signal are brought into alignment, the PLL is considered locked. Therefore, by measuring a phase difference that may be used to change a control signal provided to a controlled oscillator, a PLL is enabled to maintain a stable output signal having a constant phase angle relative to a reference signal.

BRIEF DESCRIPTION OF THE DRAWINGS

FIGS. 3A-3B illustrates the signal diagrams of FIGS. 2A-2B extended over an increased time period to show up-conversion of the frequency of the phase difference.

DETAILED DESCRIPTION OF THE INVENTION

Figure 1:
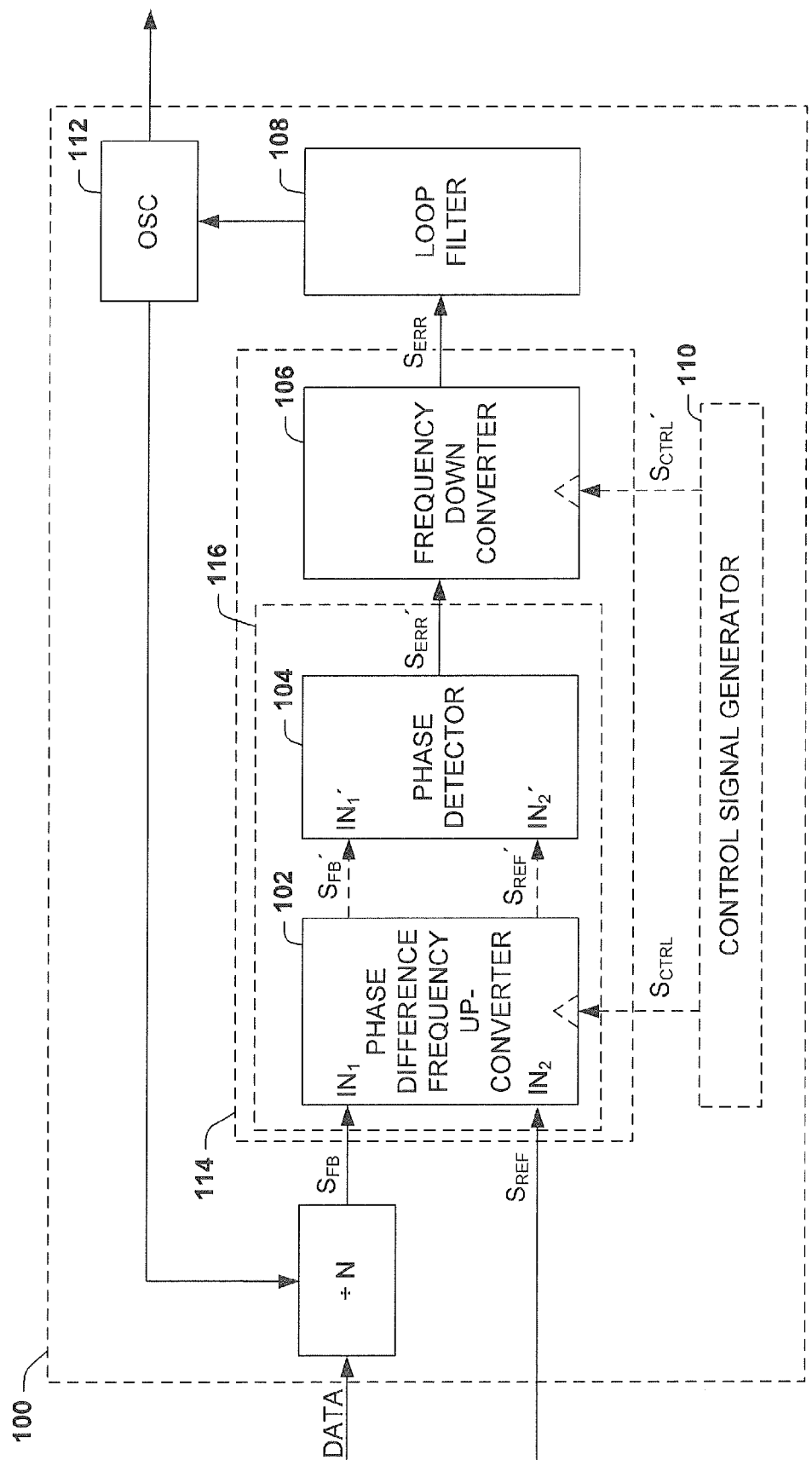
FIG. 1 illustrates a block diagram of a first embodiment of a phase-locked loop configured to reduce noise and to improve performance.

The present invention will now be described with reference to the attached drawing figures, wherein like reference numerals are used to refer to like elements throughout, and wherein the illustrated structures and devices are not necessarily drawn to scale.

A phase-locked loop (PLL) is a control system that generates an output signal having a phase that is locked, or otherwise satisfies a predetermined phase relationship, in relation to a reference signal. One relevant performance parameter of a PLL system is the phase noise of the output signal.

A phase detector may be a large source of noise in a PLL system, thereby affecting the PLL phase noise performance. Some of the noise generating mechanisms within a phase detector generate noise having a noise power that is not distributed evenly over frequency (white noise), but that is instead concentrated at low frequencies. This kind of noise, known as flicker noise or 1/f noise, comprises a large portion of harmful system noise and may result from a plurality of sources within a PLL phase detector, including impurities in a conductive channel and generation and recombination noise in a transistor due to base current, for example. Therefore, as the minimum feature size of semiconductor devices shrinks causing smaller device channel lengths, the flicker noise of active devices will increase, thereby resulting in phase detectors becoming an increasing source of performance disrupting noise.

From control loop theory it is appreciated, that inside the loop bandwidth (i.e., the frequency range where the loop gain is greater than one) the noise from the phase detector will be visible at the PLL output, but that outside the loop bandwidth the noise from the phase detector will be suppressed by the loop filter.

Unfortunately, low-frequency noise (e.g., flicker noise) from a phase detector usually falls inside the loop bandwidth and is therefore visible at the PLL output causing degradation of PLL phase noise performance. Usually, the operation frequency of the phase detector, reference frequency $f_{ref}$ (e.g., 26 MHz), is much higher than the loop bandwidth (e.g., 100 kHz). Furthermore, the Nyquist bandwidth of the phase detector, $f_{ref}/2$ (e.g., 13 MHz), is also higher than the loop bandwidth.

In appreciation of these facts, the inventor has devised a method and apparatus for improving phase detection operation by reducing flicker noise within a PLL. In one embodiment, the method and apparatus comprise providing signals to a first frequency converter configured to perform frequency conversion of the phase difference between the signals before they are provided for phase detection. During this frequency conversion before phase detection (up-conversion) the in-band frequency components (i.e., the frequency components in the loop bandwidth) in the phase difference of input signals to a phase detection circuit are converted from an in-band frequency range, where phase noise performance of the phase detection circuit is poor, to a second (e.g., higher) frequency range, where phase noise performance of the phase detection circuit is improved. An error signal, resulting from the phase detection, may then be provided to a second frequency converter. During this frequency conversion after phase detection (down-conversion) the signal components of the error signal in the second frequency range are converted to a (e.g., lower) frequency range, substantially equal to the original in-band frequency range, thereby converting the noise components produced by the phase detection circuit at the in-band frequency range to another (e.g., higher) frequency range outside the loop bandwidth that is easily filtered by the loop filter. Therefore, as provided herein the performance of a PLL is improved through frequency conversion (up-conversion) of a phase difference between signals input to a phase detector followed by a frequency conversion (down-conversion) of an error signal output from the phase detector.

FIG. 1 illustrates a block diagram of a first embodiment of a phase-locked loop 100 having a low-frequency noise suppression circuit configured to reduce low-frequency noise and to improve PLL performance. As shown in FIG. 1, an up-converter 102 is configured to receive a feedback signal $S_{FB}$ at a first input node $IN_1$ and a reference signal $S_{REF}$ at a second input node $IN_2$ and to generate two output signals, $S_{FB}'$ and $S_{REF}'$. In particular, the up-converter 102 is configured to perform a frequency conversion of a first phase difference between the input signals and to output this as a second phase difference between the first output signal $S_{FB}'$ and a second signal $S_{REF}'$. During this frequency conversion, in band frequency components in the first phase difference of the input signals are processed so that they can be output as up-converted signal components in the second phase difference of the output signals.

The output signals, having up-converted signal components in the second phase difference, are provided to a phase detector 104 that determines an error signal $S_{ERR}'$. The error signal having these up-converted signal components is then output to a down-converter 106 that is configured to down-convert the error signal. During this frequency conversion, the up-converted signal components in the error signal may be down-converted back to lower frequencies (e.g., their original, pre up-converted frequencies) to form error signal $S_{ERR}$ (i.e., a down-converted error signal). The frequency conversion of the error signal in the down-converter intrinsically converts low-frequency noise, produced by the phase detector in a first frequency range, from this first frequency range to another (e.g., higher) frequency range outside the loop bandwidth, thereby causing the low-frequency noise to be up-converted to a frequency that can be suppressed by a downstream loop filter 108.

In one embodiment, the up-converter 102 and the down-converter 106 may be coupled to a control signal generator 110 configured to respectively provide correlated control signals $S_{CTRL}$ and $S_{CTRL}'$, for up-conversion and down-conversion, resulting in the frequency components that were up-converted at the input of the phase detector being down-converted at the output from the down-converter to substantially the original frequency range. In one embodiment, correlated, time varying control signals having the same pattern (e.g., comprising a delay between $S_{CTRL}$ and $S_{CTRL}'$ to compensate for delays in signal processing) are used to control both the up-conversion and down-conversion, thereby causing both signals to be intrinsically correlated. In one embodiment, the correlated control signals are periodic.

More particularly, as illustrated in FIG. 1, the up-converter 102 may be configured to perform frequency conversion of the phase difference of the received signals by swapping received input signals, between its input nodes and its output nodes, according to the control signal $S_{CTRL}$, used for up-conversion. For example, during a first control signal state, the feedback signal $S_{FB}$ may be output at the first phase detector input node $IN_1'$ and the reference signal $S_{REF}$ may be output at a second phase detector input node $IN_2'$, while during a second control signal state the feedback signal $S_{FB}$ may be output at the second phase detector input node $IN_2'$ and the reference signal $S_{REF}$ may be output at the first phase detector input node $IN_1'$.

The signals $S_{FB}'$ and $S_{REF}'$, output from the up-converter 102, are provided to a phase detector 104. The phase detector 104 may be configured to measure the phase difference between these received signals (e.g., $S_{FB}'$ and $S_{REF}'$). In one embodiment, the phase detector 104 may measure the phase difference of the received signals by measuring the time delay between the rising edges of these signals. Based upon this measurement, the phase detector 104 will output an error signal $S_{ERR}'$ proportional to the phase difference between the received signals.

Since the phase detector measures the phase difference between signals received at the two phase detector inputs, $IN_1'$ and $IN_2'$, swapping of the received input signals by the up-converter is equivalent to inverting the polarity of the phase difference (e.g., multiplication of the phase difference of the phase detector input signals with a signal having a polarity of +1 or −1 depending on the state of the control signal, $S_{CTRL}$.) If a periodic control signal with frequency $f_{CONV}$ (e.g., $f_{ref}/2$) is used, then the up-converter swapping will essentially multiply the phase difference of the input signals of the phase detector with a signal alternating periodically between +1 or −1 (time domain point of view) and therefore up-convert the low frequency components in the phase difference signal to a frequency range around $f_{CONV}$ (frequency domain point of view).

Figure 2A:
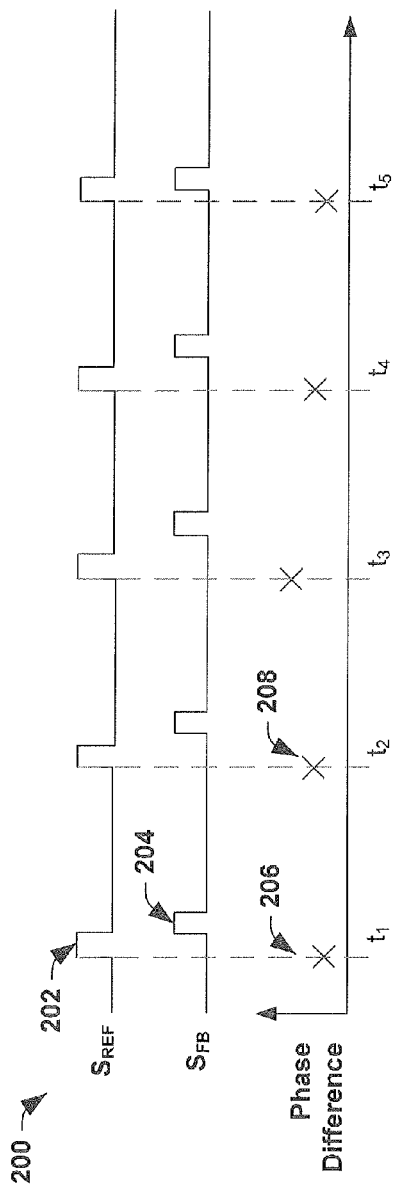
FIGS. 2A-2B. illustrate signal diagrams showing up-conversion from a first frequency to a second higher frequency by swapping the physical inputs of the phase detector.
Figure 2B:
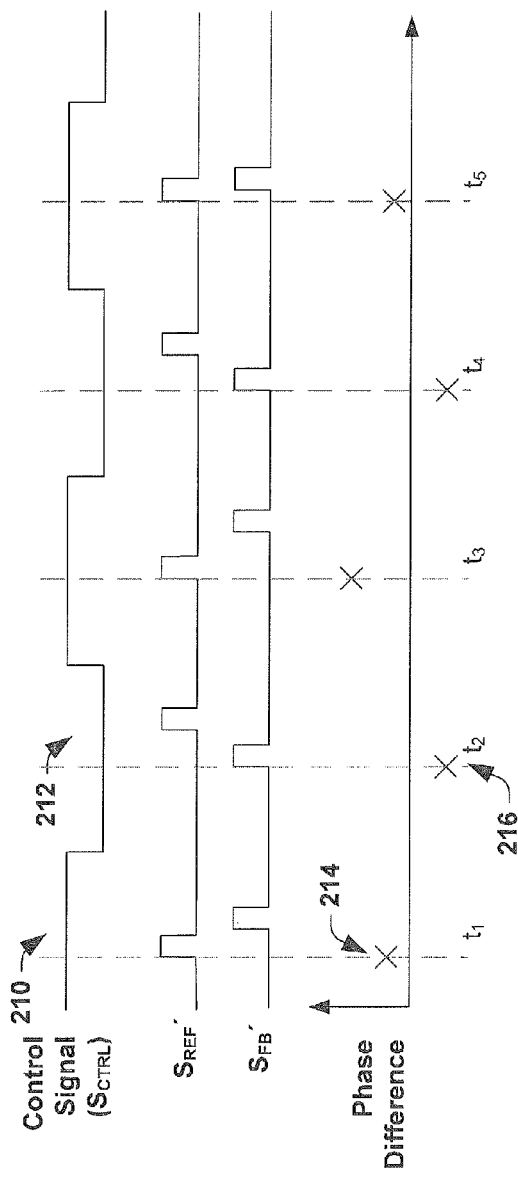

FIGS. 2A and 2B. illustrate signal diagrams showing frequency conversion of a phase difference by swapping (e.g., periodically swapping) the physical inputs of the phase detector. From a PLL control theory point of view the relevant input signals of the phase detector are not the transient waveforms (e.g., rectangular waves), but rather the phase of these waveforms, for example defined by points in time when relevant events (e.g. rising edges) occur on the transient waveforms. These events (e.g. rising edges) occur once each reference clock period, so the phase of the input signals is a time discrete signal with one sample per reference clock period. For each reference clock period the phase detector generates one sample of an error signal that is proportional to the phase difference between the input signals, resulting in an output signal that is also a time discrete signal with the same data rate as the input signals.

FIG. 2A illustrates a time discrete signal showing the phase difference between signals $S_{FB}$ and $S_{REF}$ at the input of the up-converter. As illustrated in FIG. 2A, during a first clock period, the phase difference between $S_{FB}$ 204 and $S_{REF}$ 202 is illustrated at 206. FIG. 2B illustrates a time discrete signal showing the phase difference between signals $S_{FB}'$ and $S_{REF}'$ at the output of the up-converter. As illustrated in FIG. 2B, during a first clock period 210, when the control signal $S_{CTRL}$ is in a first logic state, the input signals $S_{FB}$ and $S_{REF}$ are mapped directly to the output nodes/signals $S_{FB}'$ and $S_{REF}'$ and the phase difference 214 of the output signals of the up-converter is identical to the phase difference 206 of the input signals of the up-converter. During a second clock period 212, when the control signal $S_{CTRL}$ is in a second logic state, the mapping of the input signals to the output nodes/signals is swapped (input signals $S_{REF}$ and $S_{FB}$ are mapped to the output signals $S_{FB}'$ and $S_{REF}'$, respectively) and the phase difference 216 of the output signals and the phase difference 208 of the input signals of the up-converter have inverted polarity, as illustrated in FIG. 2B. Therefore, swapping the physical input signals of a phase detector is equivalent to inverting the phase difference of the input signals of a phase detector.

FIGS. 3A and 3B illustrate the signal diagrams of FIGS. 2A-2B extended over an extended period of time to show frequency up-conversion of the phase difference. As illustrated in FIGS. 3A-3B, input signals $S_{REF}$ and $S_{FB}$ with slowly varying phase difference (e.g., from positive to negative) are converted to output signals $S_{REF}'$ and $S_{FB}'$ with fast varying phase difference (e.g., from positive to negative) when a fast time varying control signal $S_{CTRL}$ is used for signal swapping. For example, FIG. 3A illustrates input signals having a phase difference that has a period 302 that is approximately five times longer than the period 304 of the phase difference of the up-converted signals shown in FIG. 3B. From a frequency domain point of view, low frequency components in the phase difference of the input signals $S_{REF}$ and $S_{FB}$ will be converted (shifted) to high frequencies (around the frequency of the control signal) in the phase difference of the output signals $S_{REF}'$ and $S_{FB}'$.

From FIGS. 2B and 3B, it will be appreciated that the clock frequency of signals $S_{FB}'$ and $S_{REF}'$ is not changed by the up-converter. Instead, frequency conversion based upon changing the phase polarity, as illustrated in FIGS. 2A and 2B, can be observed on the time discrete phase difference signal (e.g., 206 and 214), but not on the two physical input signals (e.g., $S_{FB}'$ and $S_{REF}'$). In other words, the clock frequency of the physical input signals provided to the phase detector will remain at $f_{ref}$, while the detected phase difference, determined by the phase detector, has an up-converted frequency.

The error signal $S_{ERR}'$ may be output to a down-converter 106. The down-converter 106 is configured to perform a frequency conversion (down conversion) of the error signal, comprising up-converted signal components. In one embodiment, the down-converter 106 may be configured to perform frequency conversion by changing the polarity of the output signal depending on a control signal $S_{CTRL}'$ (e.g., a correlated control signal delayed to compensate for processing delays between up-conversion and down-conversion circuitry). When down-converter 106 down-converts the up-converted signal components in the error signal $S_{ERR}'$ back to a frequency range substantially equal to the original frequency range, it will intrinsically up-convert the noise from the phase detector 104, at the in-band frequency range to another (e.g., higher) frequency range outside the loop bandwidth.

Figure 4:
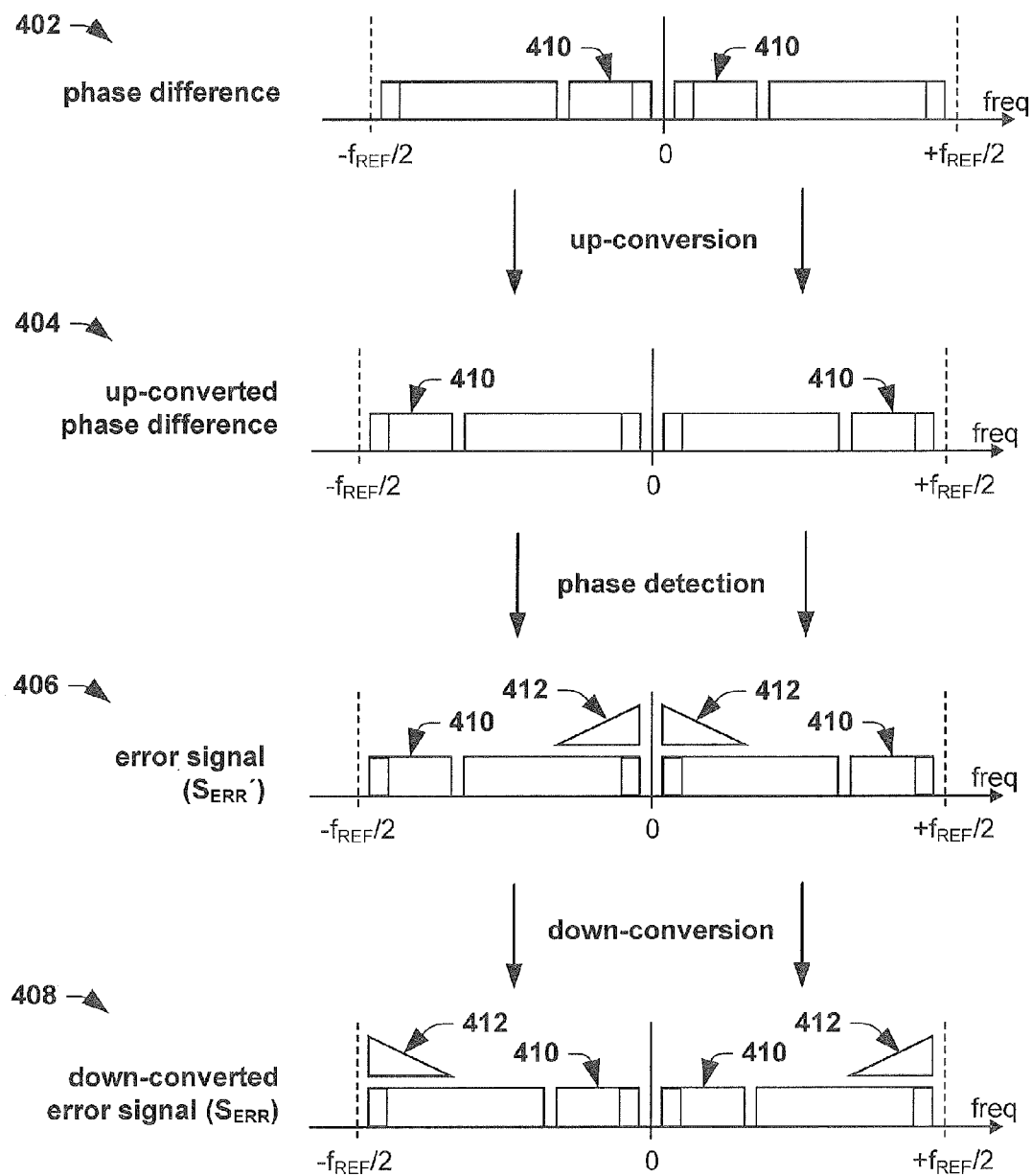
FIG. 4 illustrates diagrams showing noise suppression by frequency conversion before and after phase detection.

FIG. 4 illustrates diagrams showing noise suppression by frequency conversion before and after phase detection. As illustrated in FIG. 4, the phase difference between input signals, shown at 402, comprises in-band frequency components 410 having a low frequency range in the phase difference (e.g., close to 0) and out-of-band frequency components having a higher frequency range (e.g., up to $f_{ref}/2$). During up-conversion a correlated control signal, used for up- and down-conversion (e.g., having a frequency of $f_{ref}/2=13$ MHz), will convert the phase difference 402 between signals $S_{FB}$ and $S_{REF}$ to an up-converted phase difference 404 between signals $S_{FB}'$ and $S_{REF}'$ having in-band frequency components 410 converted from the low frequency range (e.g., DC to 100 kHz) in the phase difference 402 at the input of the up-converter to up-converted signal components (e.g., in a frequency range around 13 MHz) in the phase difference 404 at the output of the up-converter.

During phase detection the up-converted phase difference 404 will be measured and output as error signal 406 and low-frequency noise 412 (e.g., produced by the phase detector at a frequency range from DC to 1 kHz) will be added to the error signal 406. During down-conversion, the error signal 406 will be converted to the down-converted error signal 408 having the up-converted signal components 410 in the error signal 406 converted back (e.g., from around 13 MHz) to a frequency range substantially equal to the original frequency range (e.g., DC to 100 kHz) and the low frequency noise components 412 converted to a high frequency range (e.g., around 13 MHz). When the down-converted error signal $S_{ERR}$ 408, with up converted noise components 412, may be provided to a loop filter 108, the loop filter 108 will remove the up-converted noise components 412 from the error signal $S_{ERR}$ resulting in an oscillator control signal, provided to a controllable oscillator 112, having a reduced noise. In one embodiment, the loop filter 108 may comprise a PLL loop filter. In another embodiment, the loop filter 108 may comprise a FIR (finite impulse response) filter.

In an alternative embodiment, also shown in FIG. 1, a phase detection circuit 114 (e.g., for embodiments wherein a filter is configured after down-stream of the down-converter) or 116 (e.g., for embodiments wherein a filter is configured up-stream of the down-converter) may be located within a phase locked loop between an oscillator 112 and a loop filter 108 and is configured to receive feedback signal $S_{FB}$ and reference signal $S_{REF}$. The phase detection circuit 114 or 116 may be configured to output an error signal $S_{ERR}$ or down-converted error signal $S_{ERR}'$ based on a phase difference of input signals $S_{FB}$ and $S_{REF}$. In such an embodiment, noise components, that are produced within a certain frequency range during phase detection, and signal components, inherent in the phase difference of the input signals within the same frequency range, are output from the phase detection circuit as orthogonal signal components in the error signal or down-converted error signal so they can be distinguished in further signal processing and allows for noise suppression.

It will be appreciated that the method and apparatus provided herein (e.g., the apparatus shown in FIG. 1) may be applied to PLLs comprising either a digital PLL (i.e., a phase detector with digital error output and digital loopfilter) or an analog PLL. In one embodiment, wherein the PLL 100 comprises a digital PLL, the down-converter 106 may perform a frequency conversion of the error signal, output from the phase detector 104, by using digital signal processing means to multiply the error signal by a +1 or −1 depending on a control signal.

In an alternative embodiment, wherein the PLL 100 comprises an analog PLL, the PLL 100 may comprise a phase detector 104 with a differential output for the error signal $S_{ERR}'$. In such an embodiment, the polarity of the error signal $S_{ERR}'$ may be inverted by swapping the connectivity of the differential output lines. If this inversion is done depending on a control signal, this will result in a down-converted differential error output.

In one particular embodiment, one or more switches may be configured to periodically swap the connectivity of the differential output lines of the phase detector. The one or more switches may comprise one or more MOS transistors configured as passive switches.

Figure 5:
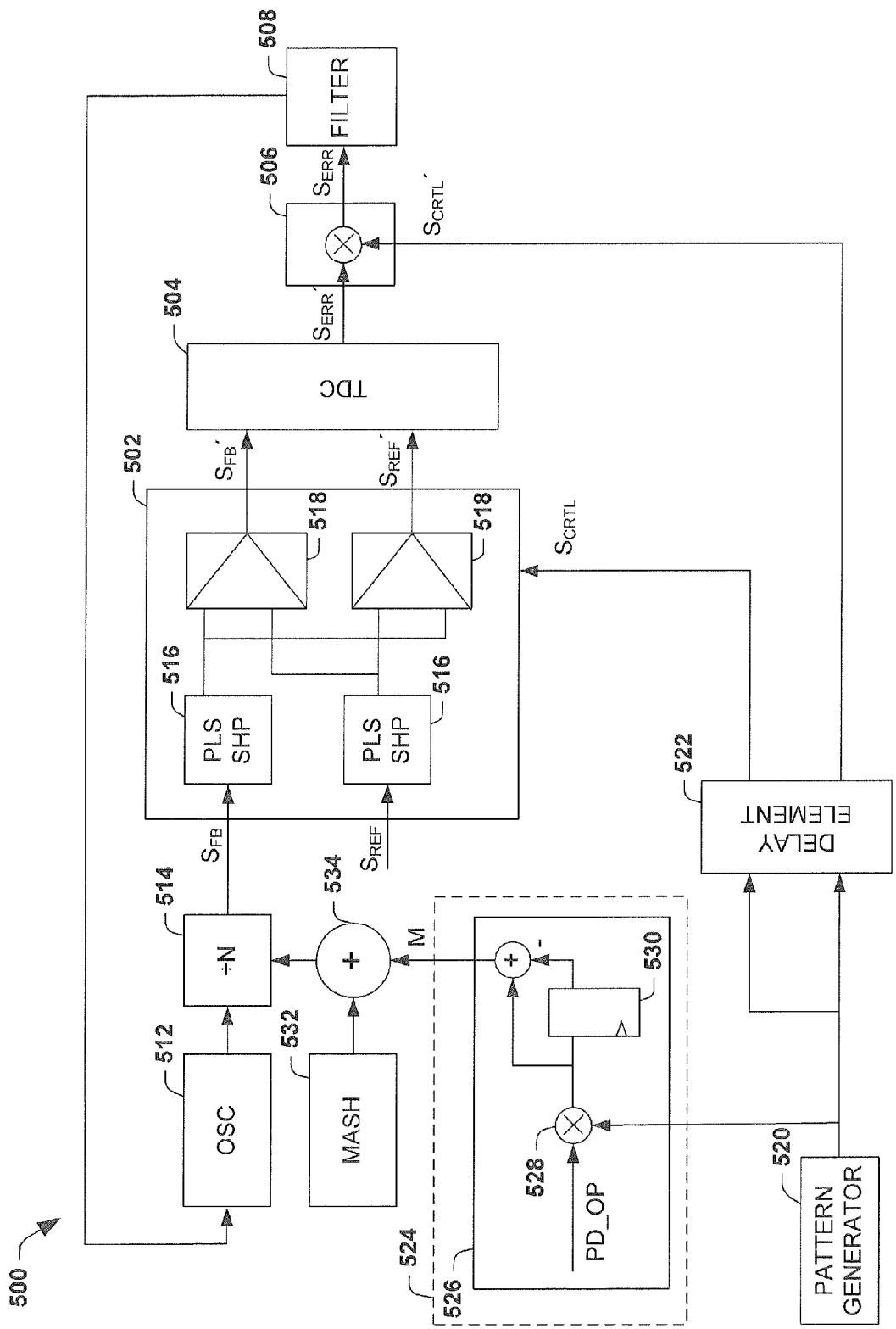
FIG. 5 illustrates a block diagram of a more detailed embodiment of a digital phase locked loop as provided herein.

FIG. 5 illustrates a more detailed embodiment of a phase locked loop 500 as provided herein. The PLL 500 comprises a digital PLL utilizing a phase detector comprising a time-to-digital converter (TDC) 504.

The PLL 500 further comprises an up-converter 502 configured to receive and up-convert the phase difference of input signals comprising a reference signal $S_{REF}$ and a feedback signal $S_{FB}$. Both input signals may comprise digital signals having a frequency equal to the reference clock frequency when the PLL 500 is locked.

The reference signal $S_{REF}$ and the feedback signal $S_{FB}$ are respectively provided to one or more pulse shaping circuits 516 comprised within the up-converter 502. The one or more pulse shaping circuits 516 are configured, in one embodiment, to change the shape of the received signals, $S_{FB}$ and $S_{REF}$, from a relatively even distribution of high and low data states (e.g., "1"s and "0"s) to a plurality of short pulses of high data states, "1", respectively displaced between longer pulses where both signals are low, "0". The short pulses, output from the pulse shaping circuits 516, improve the ability of the up-converter 502 to perform an up-conversion of the phase difference between received input signals, $S_{FB}$ and $S_{REF}$, without generating glitches since at the time of swapping both signals should have the same data state (e.g., low). For example, if the TDC phase detector 504 is working on the positive edges of the received signals, the one or more pulse shaping circuits 516 convert the positive edges of the received signals to a short pulse, thereby making it easier to have a point in time when the pulses have the same data state for switching.

The outputs of the pulse shaping circuits 516 are provided to cross coupled multiplexers 518 that are configured to swap the pulse-shaped signals between a first output node and a second output node based upon a control signal $S_{CTRL}$. By swapping the pulse shaped signals, the multiplexors 518 cause a time varying inversion of phase difference at the input of the phase detector 504 by swapping signals input to the phase detector 504, thereby performing frequency conversion of the phase difference and resulting in an up-converted phase difference. For example, during a first state (e.g., a high data state) of a control signal $S_{CTRL}$ the multiplexers 518 may be configured to provide a pulse-shaped feedback signal to a first TDC node and a pulse shaped reference input signal to a second TDC node. During a second state (e.g., a low data state) of the control signal the multiplexers 518 may be configured to provide a pulse-shaped feedback signal to a second TDC node and a pulse shaped reference input signal to a first TDC node.

The TDC phase detector 504 receives signals output from the up-converter 502 and therefrom measures a phase difference that is used to determine an error signal $S_{ERR}'$.

The down-converter 506 is configured to perform frequency conversion of the error signal $S_{ERR}'$. In a digital PLL, the down-converter 506 may utilize digital signal processing to multiply the digital error signal $S_{ERR}'$ of the TDC 504 by +1 and −1, depending on the control signal $S_{CTRL}'$, to down-convert the signal. During frequency conversion in the down-converter 506, the low-frequency noise produced by the TDC phase detector 504 will be intrinsically up-converted (e.g., to a frequency outside of the loop bandwidth) at the output of the down-converter 506.

After down-conversion, the down-converted error signal $S_{ERR}$, with up-converted low-frequency noise, may be provided to a filter 508. The low-frequency noise components from TDC phase detector 504, which have been shifted to a higher frequency outside the PLL loop bandwidth, are suppressed by the filter 508. Therefore, the filter 508 removes low-frequency noise components from the error signal.

In one embodiment, the loop filter 508 may comprise a FIR (finite impulse response) filter. At a conversion frequency $f_{conv}=f_{ref}/n$ a FIR filter with n taps may be used to average n samples of phase detector output, resulting in a zero in the filter transfer function at the conversion frequency. Therefore, a DC offset or low-frequency noise from the phase detector 504 converted to or around the conversion frequency is effectively eliminated through the use of a FIR filter.

In one embodiment, a pattern generator 520 is configured to generate a control signal that may be provided to the up-converter 502 and down-converter 506 to control up-conversion and down-conversion. In an additional embodiment, the pattern generator 520 is configured to generate a pattern signal with two logic states. In one alternative embodiment, the pattern generator 520 is configured to generate a periodic pattern signal with period $1/f_{CONV}$. In another alternative embodiment, the pattern generator 520 is configured to generate a pattern signal periodically alternating between both logic states with $f_{CONV}=f_{ref}/2$. In yet another alternative embodiment, the pattern generator 520 may be configured to generate a spectrally shaped pseudo random noise sequence that is used for frequency conversion before and after the phase detector.

In one embodiment, a delay element 522 may be utilized to compensate for delays (e.g., clock delays) in the control loop signal path between the up-converter 502 and the down-converter 506. In particular, the delay element 522 time aligns the control signal $S_{CTRL}$ for the up-converter 502 with the input signals of the up-converter and the control signal $S_{CTRL}'$ for the down-converter 506 with the input signal of the down-converter.

The frequency of the signal output by the oscillator 512 is typically greater than the frequency of the reference signal and therefore a divider 514 (e.g., divide by N divider) may be configured in the feedback path of the phase locked loop. As illustrated in FIG. 5, a divider 514, having a first divider input configured to receive an oscillator output signal from the controlled oscillator 512 and a second divider input configured to receive a divider value, is configured between a controlled oscillator 512 and the up-converter 502 to divide the frequency of the oscillator 512 to a lower frequency value. In one embodiment, the divider value for divider 514 may be generated by block 532 (e.g., a MASH delta sigma modulator). This divider value will define the oscillator frequency in relation to the reference clock frequency.

In one particular embodiment, the TDC 504 may comprise a non-symmetric phase detector that is unable to measure positive and negative delays (i.e., that is able to measure a single polarity of delays). In this embodiment the operation point of the phase detector (i.e., the average phase difference of the input signals) is different than zero in order to stay inside the operation range of the phase detector. In PLL control loops, without up-conversion and/or down-conversion before and after the phase detector, the PLL control loop itself can be used to set the desired operation point of the phase detector simply by subtracting the reference value for the operation point of the phase detector from its output value before passing it to the loop filter. The PLL control loop will then regulate the operation point of the phase detector close to the reference value. However, this method is not applicable when up-conversion and/or down-conversion is used before and after the phase detector, because DC (frequency 0) in PLL control loop is not DC at the phase detector due to the frequency conversion. In this case changing the divider factor of divider 514 by adding an additional, time varying divider value M generated by an offset generation circuitry 524 can be used to generate a DC phase shift to the signals the up-converter 502 passes to the phase detector 504. Depending on the additional divider value, the edge of the feedback signal, output from the divider 514, can be shifted to a later point of time (e.g., increasing the divider value by a positive additional divider value) or an earlier point in time (e.g., decreasing the divider value by a negative additional divider value). If this phase shift of the feedback signal is properly aligned to the phase inversion in the up-converter, then a DC phase shift can be generated at the output of the up-converter, that is at the input of the phase detector. If the mean value of this additional time varying divider value M is zero, then the average frequency of the oscillator will not be changed.

FIG. 5 illustrates one exemplary embodiment of an offset generation circuitry 524 configured to provide an additional time varying divider value M for divider 514 to set up an operation point of the phase detector 504. As illustrated in FIG. 5, the offset generation circuitry 524 utilizes a signal from the pattern generator 520, that is also used as control signal used for up-conversion and down-conversion. The additional value generator 526 is configured to receive an operation point input signal PD_OP that is multiplied with a value (e.g., +1 or −1), depending on the pattern signal, by a multiplier 528. A difference between the multiplied signal and the multiplied signal delayed by one clock cycle in delay element 530 is then determined and this additional time varying divider value M is then added to the output of block 532 (e.g., a MASH generator) via an adder 534 having an output connected to the frequency divider 514. By this means the additional time varying divider value M is configured to cause a static shift to the phase difference of the output signals of the up-converter, which is provided to the phase detector 504. This phase shift is proportional to the operation point input signal PD_OP. Accordingly, the offset generation circuitry 524 allows for real time changes to be made to the phase detector's operating point during operation without causing any disturbances.

It will be appreciated that FIG. 5 illustrates one exemplary embodiment of a circuitry (e.g., additional value generator 526) that may be used to change the operating point of the phase detector 504. However, the inventor has appreciated alternative circuits may also be utilized to change the operating point of the phase detector 504 (e.g., circuits comprising delay elements at one input of the phase detector).

It will be appreciated that by adjusting parameters of the PLL system provided herein (e.g., shown in FIG. 5) that the performance of the PLL system may be further improved. For example, in one embodiment, wherein the control signal used for both up-conversion and down-conversion is periodic and has a period of m reference clock cycles, a decimation filter based on a FIR filter with m taps can be used to reduce the data rate of the error signal output from the phase detector by a factor of m (e.g., to $f_{REF}/m$). If the polarity of the tap coefficients is chosen accordingly to the control signal, then down-conversion of the error signal can be realized in the FIR filter calculation process. If the sum of all tap coefficients is zero, then any DC offset from the phase detector and low-frequency noise from the phase detector will be suppressed by the filter. In one embodiment, wherein m=2 (i.e., $f_{CONV}=f_{REF}/2$), this calculation comprises subtracting two consecutive output values of the error signal to calculate one value of the decimated error signal. If decimation of the error output signal is used, then the data rate after decimation is reduced by a factor of 2 thereby allowing further signal processing in the PLL loop-filter can be done at reduced data rate $f_{REF}/2$.

Additional performance improvement of a PLL can be achieved if a up-converter and/or phase detector are operated on both the rising clock edge and the falling clock edge of the reference signal. In such an embodiment, the frequency of the reference signal used for phase detection is doubled and this may provide a 3 dB improvement in white noise/jitter performance in addition to the cancellation of the low-frequency noise. In one embodiment, the frequency of the correlated control signals may be equal to the frequency of the reference signal (before frequency doubling). In this embodiment any deviation of the duty cycle of the reference signal from 50% will generate a DC phase offset at the phase detector and can be suppressed in the loop-filter just as the low frequency noise. In another embodiment, decimation of an error signal, output from a digital phase detector, by factor of two may be performed for down-conversion. In this embodiment, the data rate after decimation will be equivalent to the original frequency of the reference signal before frequency doubling.

In one embodiment (not shown), wherein an analog phase detector utilizes a reset signal from a phase detector, the reset signal may be divided by two and utilized as the control signal for the up-converter and the down-converter. In particular, a reset or "measurement finished signal" available inside the phase detector may be utilized to derive a control signal for the multiplexers (e.g., 518) in the up-converter, that changes state after the latest pulse of the input signals for the current delay measurement and before the earliest pulse of both input signals for the next measurement.

Figure 6:
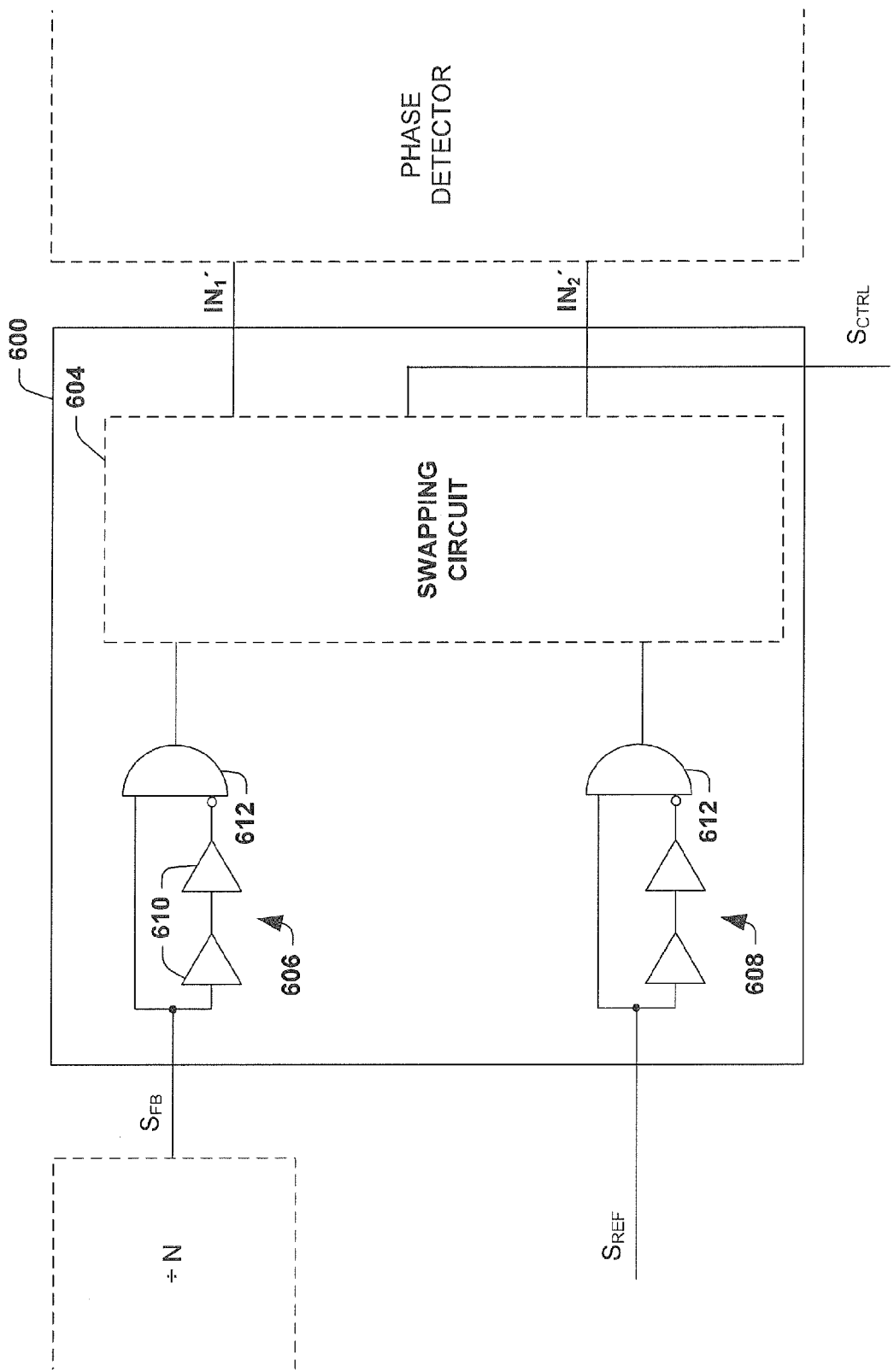
FIG. 6 illustrates an exemplary embodiment showing a schematic diagram of an up-converter as provided herein.

FIG. 6 illustrates a more detailed embodiment of an up-converter 600, as provided herein. As illustrated in FIG. 6, the up-converter 600 comprises pulse shaping circuits, 606 and 608, configured to shape the pulses of the received signals (e.g., $S_{FB}$ and $S_{REF}$) into a shaped signal comprising short pulses that allow the up-converter to avoid glitches. The up-converter 600 also comprises a swapping circuitry 604, configured to swap the short pulses between the inputs of the phase detector.

In one embodiment, illustrated in FIG. 6, the pulse shaping circuits 606, 608 may respectively comprise two signal paths configured to provide a signal (e.g., reference input signal $S_{REF}$, feedback signal $S_{FB}$) to a digital logic gate 612 (e.g., an AND gate). The first signal path couples the signal directly to the logic gate 612. The second signal path, comprising a string of one or more delay elements 610 (e.g., buffers), is configured to provide a delay to the signal. Therefore, the signals received through the first and second paths will comprise an offset relative to one another, so that the rising edge of the signals received at the logic gate 612 are offset in time.

As illustrated in FIG. 6, the digital logic gate 612 comprises an AND gate with an inverted input. When the AND gate receives a first signal having a high data state and a second signal having a low data state it will output a signal having a high data state. Otherwise, for all other signal combinations (e.g., a first and second signal having a low data state), the AND gate 612 will output a signal having a low data state. Accordingly, the AND gate 612 will output a signal comprising short pulses having a high data state surrounded by a longer pulses having a low data state, wherein the length of the pulses is determined by the delay in the delay elements 610.

The swapping circuitry 604 may be configured, in one embodiment, to swap the pulse generated feedback and reference input signals between a first terminal $IN_1'$ and a second terminal $IN_2'$ of a phase detector such that artificial edges (i.e., glitches) are not generated at the phase detector input. For example, the signals provided to the swapping circuitry 604, have the same logic state at the time when the correlated control signal $S_{CRTL}$ causes a swap. Usually, if the PLL is locked the time difference between the relevant edges of both signals used for phase comparison is small compared to the reference clock period. If the relevant edges of both signals can be converted to short pulses of same logic state, then the pulsed signals will have the same logic state during a high portion of the reference period. This makes it easy to align/delay the control signal for the swapping circuit 604 (e.g., multiplexers) properly to the period where both signals have the same logic state. Alternatively, at the start of PLL operation, if a PLL is not locked it may be good to deactivate up-conversion and down-conversion and then activate the up-conversion and down-conversion after PLL has settled and the time difference between the relevant edges of both signals used for phase comparison is small enough to ensure glitch free switching at the swapping circuit 604.

Figure 7:
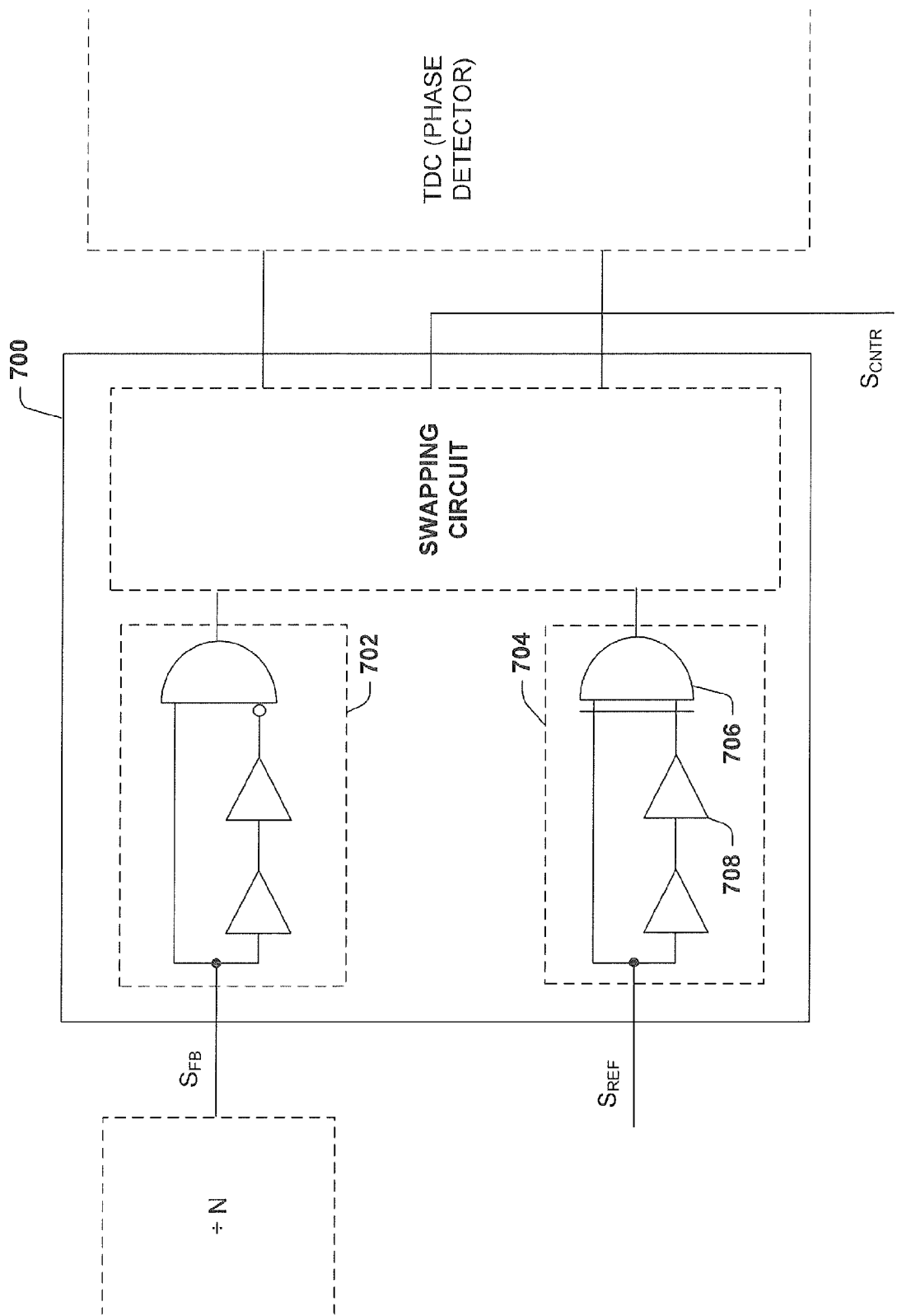
FIG. 7 illustrates an exemplary embodiment showing a schematic diagram of an up-converter as provided herein.

FIG. 7 illustrates an alternative embodiment of an up-converter 700 comprising a first pulse shaping circuitry 702 and a second pulse shaping circuitry 704. As illustrated in FIG. 7, the second pulse shaping circuitry 704 is configured to perform both pulse shaping and frequency doubling. In particular, the second pulse shaping circuitry 704 comprises two current paths configured to provide a signal to a digital logic gate 706 (e.g., an XOR gate). The first path couples the signal directly to the logic gate 706. The second path, comprising a string of one or more delay elements 708 (e.g., buffers), is configured to provide a delay to the signal. Therefore, the signals received through the first and second paths will comprise a relative delay, so that the edges of the signals received at the logic gate 706 will be offset in time resulting in short pulses at the output when rising or falling edges occur on the input signal of the pulse shaping circuitry.

Figure 8:
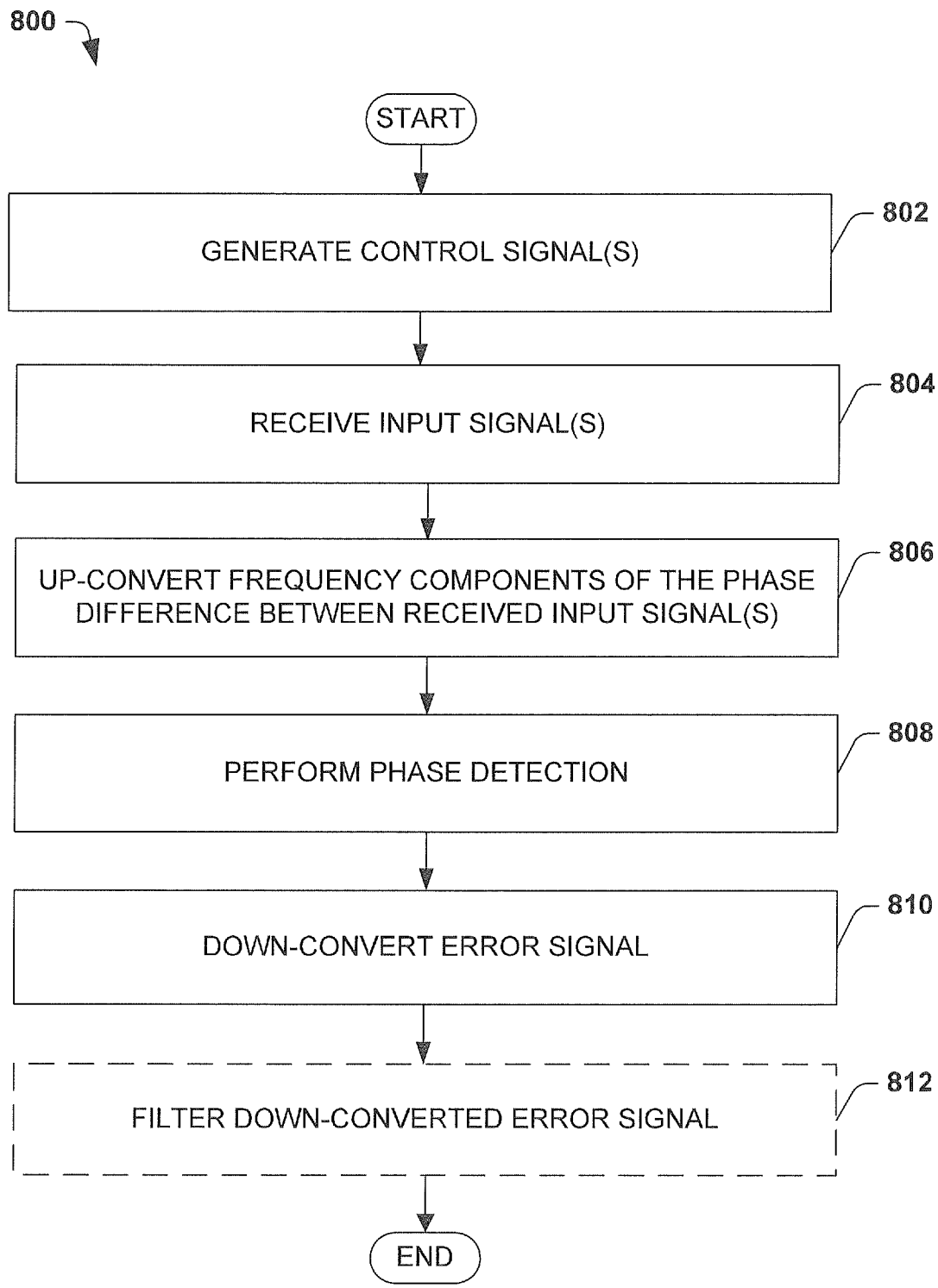
FIG. 8 illustrates an exemplary method for reducing flicker noise and improving performance of a phase-locked loop.

FIG. 8 illustrates an exemplary method 800 for reducing low frequency flicker noise in a phase locked loop. The method comprises performing frequency conversion of the phase difference between input signals, resulting in conversion of noise performance relevant frequency components in the phase difference from a first frequency range, to a second (e.g., higher) frequency range. The frequency of an error signal resulting from the phase detection is then frequency down-converted to a (e.g., lower) frequency range substantially equal to the original frequency range, thereby intrinsically converting low-frequency noise, produced during phase detection, to another (e.g., higher) frequency range that is easily filtered.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 802 one or more control signals are generated. In one embodiment, the one or more control signals may comprise correlated control signals, using substantially the same pattern (e.g., comprising a delay between to compensate for delays in signal processing) to control both up-conversion (e.g., 806) and down-conversion (e.g., 810). In another additional embodiment, the one or more control signals may comprise an alternating signal with frequency $f_{CONV}$, equal to one half the reference clock frequency, $f_{ref}/2$, (i.e., the Nyquist frequency) for both up-conversion and down-conversion.

At 804 one or more input signal(s) are received. The input signals may comprise a reference signal received from a source outside of a PLL and a feedback signal received from a PLL feedback loop.

Noise performance relevant frequency components of the phase difference between received input signals are up-converted at 806. In one embodiment, up-conversion may comprise frequency converting signal components of the phase difference of the received input signals from a first frequency range (e.g., within a PLL loop bandwidth where noise performance of the phase detector is poor) to another (e.g., higher) frequency range, resulting in output signals having up-converted signal components in the phase difference of the output signals based upon the noise performance relevant frequency components of the received input signals.

In one embodiment, wherein method 800 is performed in a PLL, the up-conversion comprises converting the in-band frequency components of the phase difference between input signal from the in-band frequency range, where phase noise performance of the phase detector is poor, to another frequency range, where phase noise performance of the phase detector is improved. In one embodiment, the phase difference of the received signal(s) (e.g., a reference signal and a feedback signal) may be up-converted according to a control signal or a clock signal (e.g., generated at 802).

In one embodiment, frequency conversion of the phase difference between the input signals may be performed by periodically inverting the polarity of the phase difference between the received input signals at a frequency $f_{CONV}$. For example, in one embodiment, wherein the up-converted signals are provided to a phase detector, this may be accomplished by swapping received input signals between a first and second input node of the phase detector at a frequency $f_{CONV}$.

At 808 phase detection is performed. In one embodiment, phase detection may comprise measuring a phase difference (e.g., the time difference between rising edges of a feedback signal and a reference signal) between signals resulting from the up-conversion and generating an error signal proportional to the value of the measured difference.

A down-conversion of the error signal is performed at 810. Down-conversion of the error signal may comprise frequency converting the up-converted frequency components of the error signal to a (e.g., lower) frequency range substantially equal to the original, pre up-converted, frequency range. During down-conversion of the error signal, low-frequency noise components produced during the phase detection will be up-converted to another (e.g., higher) frequency range. In one embodiment, the low-frequency noise is up-converted to a frequency range outside of the loop bandwidth that is easily filtered.

It will be appreciated that down conversion of the error signal may comprise down conversion of an error signal that is subjected to intermediate processing between phase detection and down conversion. For example, down conversion of the error signal may comprise down conversion of an error signal that has been filtered subsequent to phase detection and prior to down conversion.

In one embodiment, down-conversion of an error signal may be performed by periodically inverting the polarity of the error signal at a frequency $f_{CONV}$. For example, in one embodiment, down-conversion may comprise periodically swapping the differential output nodes of a PLL phase detector according to a correlated control signal or clock signal utilized to perform both up-conversion (e.g., act 804) and down-conversion. In an alternative embodiment, down-conversion may be performed by using a digital signal processing means to periodically multiply the error signal by +1 and −1.

At 812 the down-converted error signal, having an up-converted low-frequency noise is filtered. In one embodiment, filtering the down converted error signal removes the up-converted low frequency noise components, outside of the loop bandwidth, from the error signal, resulting in an error signal having a reduced noise.

Although the invention has been illustrated and described with respect to one or more implementations, alterations and/or modifications may be made to the illustrated examples without departing from the spirit and scope of the appended claims.

For example, one of ordinary skill in the art will readily appreciate that a loop filter may be placed before down-converter without altering the operation of the invention (e.g., a bandpass filter configured to receive the output of phase detector before down-converter may replace the lowpass filter shown in FIGS. 1 and 4 after the down-converter).

Furthermore, in regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A noise suppression circuit in a phased locked-loop, comprising:
    a frequency up-converter configured to receive a feedback signal from an output of the phase-locked loop and a reference signal, to selectively perform frequency conversion of a frequency at which a phase difference between the feedback signal and the reference signal changes from a first frequency range to a second frequency range, and to generate a first output signal and a second output signal having the phase difference that varies at the second frequency range; and
    a phase detector configured to receive the first and second output signals from the up-converter, to measure the phase difference, and to generate an error signal proportional to the measured phase difference,
    wherein flicker noise, produced by the phase detector during measurement of the phase difference is output in the error signal at the first frequency range, so as to be distinguishable from the phase difference, which is output in the error signal at the second frequency range.

2. The circuit of claim 1, wherein the frequency converter comprises an up-converter configured to convert the frequency at which the phase difference between the feedback signal and the reference signal changes from the first frequency range, which comprises an in-band frequency range wherein the gain of the phase-locked loop is greater than one, to the second frequency range, which is greater than the in-band frequency range.

3. The circuit of claim 2, wherein the frequency conversion in the up-converter is performed by alternatively:
    providing the feedback signal as a first output signal and the reference signal as a second output signal; and
    providing the feedback signal as the second output signal and the reference signal as the first output signal.

4. The circuit of claim 2, further comprising:
    a down-converter configured to perform frequency conversion that down-converts the frequency at which the phase difference changes from the second frequency range to the first frequency range and that up-converts the flicker noise from the first frequency range to the second frequency range.

5. The circuit of claim 4, further comprising a control signal generator configured to provide correlated, time varying control signals, to the up-converter and the down-converter;
    wherein the up-converter is configured to perform frequency conversion of the frequency at which the phase difference changes based upon one of the time varying control signals; and
    wherein the down-converter is configured to perform frequency conversion of a frequency at which the error signal changes to generate the down-converted error signal based upon one of the time varying control signals.

6. The circuit of claim 5, wherein the up-converter is configured to perform the frequency conversion by inverting the polarity of the phase difference based upon one of the correlated, time varying control signals.

7. The circuit of claim 6, wherein inverting the polarity of the phase difference, comprises:
    alternatively providing the feedback signal as a first output signal and the reference signal as a second output signal, and providing the feedback signal as the second output signal and the reference signal as the first output signal.

8. The circuit of claim 5, wherein the down-converter is configured to perform the frequency conversion by inverting the polarity of the error signal output from the phase detector based upon one of the correlated, time varying control signals.

9. The circuit of claim 8, wherein the phase detector is configured to provide a differential error output so that the down-converter inverts the polarity of the error signal by swapping signals of the differential error output.

10. The circuit of claim 7, wherein the down-converter further comprises a pulse shaping circuit configured to receive the reference signal and to output a shaped signal having a short pulse having a first data state surrounded by longer pulses having a second data state.

11. The circuit of claim 5, further comprising a FIR filter configured to receive the down-converted error signal and to filter the flicker noise produced by the phase detector, which has been up-converted to the second frequency range during the frequency conversion performed by the down-converter.

12. The circuit of claim 5, further comprising:
    a controlled oscillator having a control input and an output that provides an oscillator output signal;
    a frequency divider located in a feedback path of a phase locked loop, the frequency divider comprising:
        a first divider input configured to receive the oscillator output signal from the controlled oscillator,
        a second divider input configured to receive a divider value, and
        a divider output configured to provide the feedback signal to the up-converter;
    an offset generation circuitry configured to provide an additional time varying offset value to the divider value, wherein the additional time varying offset value causes a static shift to the second phase difference, between the first output signal and the second output signal of the up-converter.

13. The circuit of claim 12, wherein the offset generation circuitry comprises:
    an additional value generator comprising:
        a multiplier configured to multiply an operation point input signal with a value of +1 or −1 depending on one of the correlated, time varying control signals, and
        a delay element connected to the output of the multiplier;
        an adder having an output connected to the frequency divider, wherein the adder is configured to calculate a difference between the output of the multiplier and the output of the delay element.

14. The circuit of claim 5, wherein the correlated, time varying control signals comprise periodic signals.

15. The circuit of claim 5, wherein the up-converter and the phase detector are configured to operate on a rising edge and a falling clock edge of the reference signal.

16. The circuit of claim 15, wherein a data rate at the output of the down-converter is decimated by a factor of two.

17. A method for reducing flicker noise in a phase-locked loop, comprising:
- up-converting a frequency at which a phase difference between a reference signal and a feedback signal changes by performing frequency conversion of the phase difference to generate an up-converted phase difference
- measuring the up-converted phase difference and generating an error signal based on the up-converted phase difference; and
- down-converting a frequency at which the error signal changes by performing frequency conversion of the error signal to generate a down-converted error signal, wherein a low-frequency flicker noise produced during measuring the up-converted phase difference will be frequency converted to a higher frequency and output as up-converted low frequency flicker noise in the down-converted error signal.

18. The method of claim 17, further comprising generating correlated control signals that are utilized to perform both the frequency conversion of the phase difference and the frequency conversion for down-converting the error signal.

19. The method of claim 18, wherein up-converting the phase difference comprises inverting the polarity of the phase difference between the reference signal and the feedback signal based upon one of the correlated control signals to generated the up-converted phase difference.

20. The method of claim 19, wherein based on one of the correlated control signals, up-converting the phase difference comprises:
- providing the feedback signal as a first output signal and the reference signal as a second output signal; or
- providing the feedback signal as the second output signal and the reference signal as the first output signal,
- wherein the phase difference between the first and second output signals is the up-converted phase difference.

21. The method of claim 18, wherein down-converting the error signal comprises inverting the polarity of the error signal based upon one of the correlated control signals to generate the down-converted error signal.

22. The method of claim 17, further comprising filtering the up-converted low-frequency flicker noise from the down-converted error signal.

23. A low-frequency noise suppression circuit, comprising:
- an up-converter configured to receive a feedback signal and an reference signal and, based on one of two or more correlated, time varying control signals, to alternatively:
  - provide the feedback signal as a first output signal and the reference signal as a second output signal; and
  - provide the feedback signal as the second output signal and the reference signal as the first output signal;
- a phase detector configured to receive the first output signal at a first input node of the phase detector and the second output signal at a second input node of the phase detector, to measure a phase difference between the first and second output signals, and to determine an error signal based upon the measured phase difference; and
- a down-converter configured to perform frequency conversion to provide a down-converted error signal by inverting the polarity of the error signal output from the phase detector based upon one of the two or more correlated, time varying control signals and thereby converting a low-frequency noise produced by the phase detector in the error signal at in band frequencies to higher frequencies in the down-converted error signal.

\* \* \* \* \*